(12) United States Patent
Todorov et al.

(10) Patent No.: US 10,658,156 B1
(45) Date of Patent: May 19, 2020

(54) SYSTEM AND METHOD FOR IMPROVED SCANNED SPOT BEAM

(71) Applicant: APPLIED Materials, Inc., Santa Clara, CA (US)

(72) Inventors: Stanislav S. Todorov, Topsfield, MA (US); Jeffrey Morse, Newburyport, MA (US); John Sawyer, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/265,002

(22) Filed: Feb. 1, 2019

(51) Int. Cl.
  *H01J 37/317* (2006.01)
  *H01J 37/302* (2006.01)
  *G02B 26/10* (2006.01)

(52) U.S. Cl.
  CPC ........ *H01J 37/3171* (2013.01); *G02B 26/101* (2013.01); *H01J 37/3023* (2013.01)

(58) Field of Classification Search
  CPC .. H01J 37/3171; H01J 37/3023; H01J 37/302; H01J 2237/24535; H01J 2237/24542; G02B 26/101
  See application file for complete search history.

(56) References Cited

U.S. PATENT DOCUMENTS

| | | | | |
|---|---|---|---|---|
| 2006/0284114 A1* | 12/2006 | Olson | ................... | H01J 37/304 250/492.21 |
| 2007/0085037 A1* | 4/2007 | Chang | ................. | H01J 37/3171 250/492.21 |
| 2012/0248324 A1* | 10/2012 | Eisner | ................... | H01J 37/302 250/396 ML |

* cited by examiner

*Primary Examiner* — David E Smith
(74) *Attorney, Agent, or Firm* — Nields, Lemack & Frame, LLC

(57) ABSTRACT

A system and method for generating a plurality of scan profiles based on a desired implant pattern and the uniformity of the spot beam is disclosed. The system scans the spot beam and records the number of ions as a function of position. This is referred to as the linear uniformity array. The desired implant pattern and the linear uniformity array are then combined to generate a composite pattern array. This array contemplates the non-uniformity of the scanned beam and allows the system to create scan profiles that compensate for this. The software may be executed on the controller disposed in the implantation system, or may be executed on a different computing device.

17 Claims, 6 Drawing Sheets

SYSTEM AND METHOD FOR IMPROVED SCANNED SPOT BEAM

FIELD

Embodiments of the present disclosure relate to a system and method for controlling a scanned spot beam, and more particularly to a scanned beam ion implanter.

BACKGROUND

Various types of ion sources may be used to create the ions that are used in semiconductor processing equipment. For example, in certain embodiments, a spot beam may be created by an ion source. A spot beam is one in which the ions are transported as a beam having a substantially circular cross-section. This spot beam may enter an electrostatic scanner. The electrostatic scanner deflects the spot beam at varying angles in a first direction. For example, in certain embodiments, the electrostatic scanner may deflect the spot beam in the horizontal direction. The amount of deflection may be at least as large as the diameter of the workpiece that is being processed by the spot beam. In this way, ions are implanted into the workpiece across its entire width. Typically, the workpiece is disposed on a movable workpiece holder, which is moved in a second direction. This second direction may be perpendicular the first direction. In some embodiments, the workpiece holder translates the workpiece in the vertical direction. In this way, the entirety of the workpiece may be processed. In other words, the spot beam is deflected back and forth in the first direction, while the workpiece is translated in the second direction.

One issue associated with the use of a spot beam is non-uniformity of the ions in the first direction. Specifically, the dose implanted in the workpiece may vary as a function of position in the first direction. This may be due to non-uniformities in the electrostatic scanner.

Conventionally, this non-uniformity is corrected prior to implantation. For example, a beam monitor, such as a plurality of Faraday cups may be disposed downstream from the electrostatic scanner. The beam monitor determines the number of ions as a function of the position in the first direction. Based on this, the scan rate of the electrostatic scanner may be modified so that the resulting beam is uniform in the first direction. Stated differently, the scan rate of the electrostatic scanner may be made non-uniform in order to achieve uniformity of the dose delivered to the workpiece. This may be referred to as the first stage of the process to achieve a desired two-dimensional dose. This first stage achieves a uniform dose in the first direction.

Once the non-uniformity of the spot beam in the first direction has been corrected, the second stage of the process is initiated. In the case of a patterned implant, the second stage may involve adjustments to the scan rate of the electrostatic scanner as a function of position in the second direction. For example, the desired implant pattern may not be uniform in at least one of the first or second direction. Thus, the second stage of the process uses the desired implant pattern to determine the scan rate in the first direction as a function of position in the second direction.

Thus, in order to implant ions into a workpiece using a spot beam, a uniformity tuning process that achieves beam uniformity in the first direction is performed. This process is time consuming and lowers overall utilization of the ion beam implanter.

Thus, it would be advantageous if there were a system and method that generated the desired implant pattern in a workpiece without having to perform the uniformity tuning process.

SUMMARY

A system and method for generating a plurality of scan profiles based on a desired implant pattern and the uniformity of the spot beam is disclosed. The system scans the spot beam and records the number of ions as a function of position. This is referred to as the linear uniformity array. The desired implant pattern and the linear uniformity array are then combined to generate a composite pattern array. This array contemplates the non-uniformity of the scanned beam and allows the system to create scan profiles that compensate for this. The software may be executed on the controller disposed in the implantation system or may be executed on a different computing device.

According to a first embodiment, a method of scanning a spot beam to achieve a desired implant pattern is disclosed. The method comprises creating a Desired Implant Pattern array based on the desired implant pattern; scanning the spot beam, using a scanner, in an X-direction at a constant speed; monitoring beam current as a function of position in the X-direction using a beam profiler; creating a Linear Uniformity array, where values of elements in the Linear Uniformity array are indicative of beam current at a respective position in the X-direction; measuring a current profile of the spot beam in the X-direction and a Y-direction, perpendicular to the Y-direction; creating a Spot Beam Current Profile array, where values of elements in the Spot Beam Current Profile array are indicative of a current of the spot beam at a location in the X-direction and the Y-direction; using the Linear Uniformity array and the Desired Implant Pattern array to create a Composite Pattern array, where the Composite Pattern array contemplates non-uniformity of the scanned spot beam in the X-direction; creating a final set of scan profiles to achieve the Composite Pattern array based on the Spot Beam Current Profile array; and applying the final set of scan profiles to the scanner to achieve the desired implant pattern. In certain embodiments, for each row of the Desired Implant Pattern array, each element in a row of the Desired Implant Pattern array is divided by a corresponding element in the Linear Uniformity array to form a row of the Composite Pattern array.

According to another embodiment, an implantation system that uses a spot beam to achieve a desired implant pattern into a workpiece is disclosed. The system comprises an ion source to create the spot beam; a scanner to scan the spot beam in an X-direction; a workpiece holder to move a workpiece in a Y-direction; a beam profiler; and a system controller, wherein the system controller is adapted to: scan the spot beam, using the scanner, in the X-direction at a constant speed; monitor beam current as a function of position in the X-direction using the beam profiler; create a Linear Uniformity array, where values of elements in the Linear Uniformity array are indicative of a beam current at a respective position in the X-direction; measure a current profile of the spot beam in the X-direction and the Y-direction, perpendicular to the X-direction; create a Spot Beam Current Profile array, where values of elements in the Spot Beam Current Profile array are indicative of a current of the spot beam at a location in the X-direction and the Y-direction; create a Desired Implant Pattern array based on the desired implant pattern; use the Linear Uniformity array and the Desired Implant Pattern array to create a Composite Pattern array, where the Composite Pattern array contemplates non-uniformity of the scanned spot beam in the X-direction; create a final set of scan profiles to achieve the Composite Pattern array based on the Spot Beam Current Profile array; and apply the final set of scan profiles to the scanner to achieve the desired implant pattern.

According to another embodiment, a software program, disposed on a non-transitory computer readable storage media, is disclosed. The software program, when executed by a system controller, enables the system controller to create a Desired Implant Pattern array based on a desired implant pattern; monitor beam current as a function of position in an X-direction using a beam profiler as a spot beam is scanned in the X-direction at a constant speed; create a Linear Uniformity array, where values of elements in the Linear Uniformity array are indicative of a beam current at a respective position in the X-direction; create a Spot Beam Current Profile array, where values of elements in the Spot Beam Current Profile array are indicative of a current of the spot beam at a location in the X-direction and a Y-direction; use the Linear Uniformity array and the Desired Implant Pattern array to create a Composite Pattern array, where the Composite Pattern array contemplates non-uniformity of the scanned spot beam in the X-direction; create a final set of scan profiles to achieve the Composite Pattern array based on the Spot Beam Current Profile array; and apply the final set of scan profiles to a scanner to achieve the desired implant pattern.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
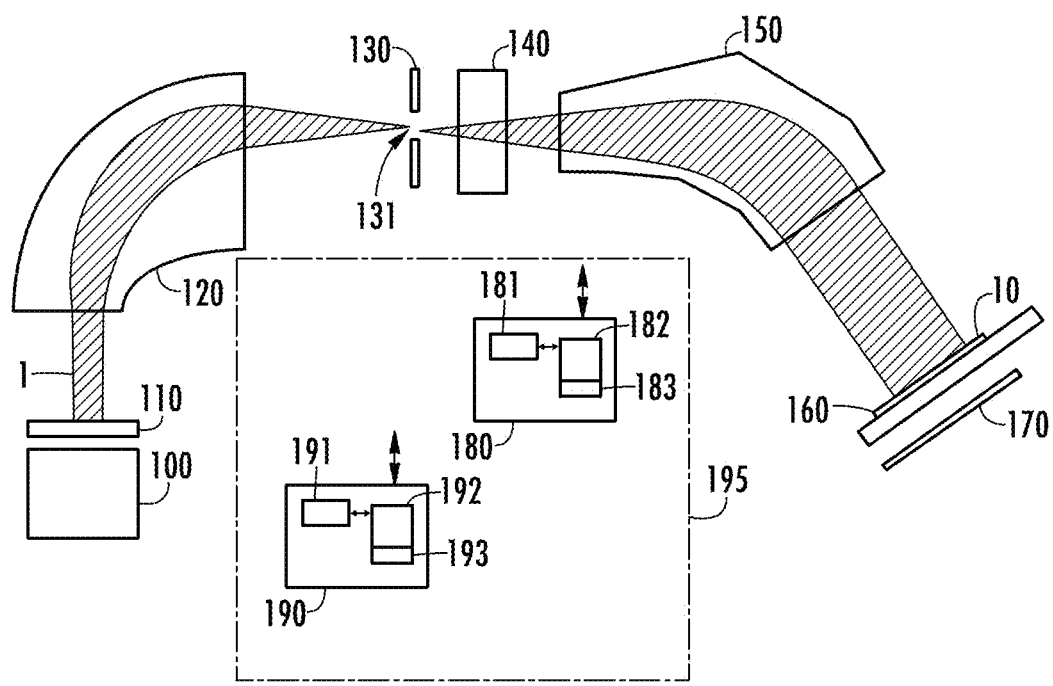
FIG. 1 is an ion implanter that utilizes a spot beam according to one embodiment.

FIG. 1 shows a spot beam ion implantation system that may be used for creating a two-dimensional scan pattern using a spot beam according to one embodiment.

The spot beam ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics are aligned such that the ions 1 pass through both apertures.

Located downstream from the extraction optics 110 is a mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system. The ions that pass through the mass resolving device 130 may form a spot beam.

The spot beam may then enter a scanner 140 which is disposed downstream from the mass resolving device 130. The scanner 140 causes the spot beam to be fanned out into a plurality of divergent beamlets. The scanner 140 may be electrostatic or magnetic. In certain embodiments, a collimator 150 then converts these divergent beamlets into a plurality of parallel beamlets that are directed toward the workpiece 10. In other embodiments, a collimator 150 may not be employed.

The workpiece 10 is disposed on a movable workpiece holder 160.

In certain embodiments, the direction of the ion beam is referred to as the Z-direction, the direction perpendicular to this direction and horizontal may be referred to as the X-direction, while the direction perpendicular to the Z-direction and vertical may be referred to as the Y-direction. In this example, it is assumed that the scanner 140 scans the spot beam in the X-direction while the movable workpiece holder 160 is translated in the Y-direction.

A beam profiler 170 may be disposed proximate the region of the workpiece 10. The beam profiler 170 may be used to measure certain parameters associated with the spot ion beam, which include beam current as a function of position. The beam profiler 170 may comprise one or more Faraday devices arranged in a linear manner. In another embodiment, the beam profiler 170 may comprise a plurality of Faraday devices arranged in a two-dimensional array. The Faraday devices collect current and the beam profiler 170 is able to measure an amount of current collected by each Faraday device. In certain embodiments, the movable workpiece holder 160 may be moved so that it is not impacted by the spot beam. In this way, the spot beam strikes the beam profiler 170.

While the beam profiler 170 is illustrated as being near the workpiece 10, it is understood that it may be located in other locations in the system. For example, in one embodiment, the beam profiler 170 may be disposed in the position typically occupied by the workpiece 10 during operation. In this way, the beam profiler 170 provides feedback that is representative of the current that is experienced by the workpiece 10.

A controller 180 is also used to control the system. The controller 180 has a processing unit 181 and an associated memory device 182. This memory device 182 contains the instructions 183, which, when executed by the processing unit, enable the system to perform the functions described herein. This memory device 182 may be any non-transitory storage medium, including a non-volatile memory, such as a FLASH ROM, an electrically erasable ROM or other suitable devices. In other embodiments, the memory device 182 may be a volatile memory, such as a RAM or DRAM. In certain embodiments, the controller 180 may be a general purpose computer, an embedded processor, or a specially designed microcontroller. The actual implementation of the controller 180 is not limited by this disclosure.

Further, this disclosure describes the creation and use of various arrays. In one embodiment, these arrays may be stored in the memory device 182. Further, this disclosure describes several software programs. These software programs comprise a plurality of instructions that perform a certain function. In certain embodiments, the software programs are also stored in the memory device 182.

However, in another embodiment, the arrays and software programs are stored in a second computing unit 190, such as a server or personal computer. The second computing unit 190 has a processing unit 191 and an associated memory device 192. The software programs 193 and arrays described herein may be stored in this associated memory device 192 and executed with the processing unit 191 of the second computing unit 190. In these embodiments, the desired implant pattern and the linear uniformity array are transmitted to this second computing unit 190, which calculates the scan profiles. The scan profiles that are created by this second computing unit 190 are transferred to the controller 180, such as via a network connection.

In this disclosure, the controller 180 and the second computing unit 190 form the system controller 195. Throughout this disclosure, the function of the system controller 195 is the combination of all actions performed by either the controller 180 or the second computing unit 190.

As stated above, in certain embodiments, the controller 180 may perform all of the functions described herein. In this embodiment, the system controller 195 may be the same as the controller 180. In other embodiments, some of the computationally intensive tasks are performed by the second computing unit 190. Thus, in this embodiment, the system controller 195 is the combination of the controller 180 and the second computing unit 190. The disclosure is not limited to any particular partition of tasks between the controller 180 and the second computing unit 190.

The controller 180 may be in communication with the beam profiler 170, the scanner 140 and the movable workpiece holder 160 as described in more detail below. In certain embodiments, the controller 180 is in communication with a second computing unit 190, as described above.

The beam profiler 170 may be used to provide two types of information.

For example, by moving the spot beam along the X-direction using the scanner 140, the beam profiler 170 may be able to determine the relationship between beam current and position in the X-direction.

Figure 2:
FIG. 2 shows beam current as a function of X position in one embodiment.

FIG. 2 shows a graph 200 that may be created using the beam profiler 170. In this example, the controller 180 instructs the scanner 140 to scan the spot beam from a first edge 201 of the workpiece 10, past the center 202 of the workpiece 10, to the opposite second edge 203 at a uniform rate. As the spot beam is scanned, ions are collected by the beam profiler 170. The system controller 195 then receives the data from the beam profiler 170. In certain embodiments, a uniform scan rate does not result in a uniform dose in the X-direction. FIG. 2 shows that the dose applied near the edges 201, 203 of the workpiece 10 is greater than the dose applied to the center 202 of the workpiece 10. Of course, other graphs are also possible and FIG. 2 is merely illustrative. The graph 200 may be stored in the non-transitory storage element as a one dimensional array, where the value on each element in the array represents the beam current at that particular X-direction position. In one embodiment, each element in the array represents the average current in a region that is 7.5 mm in the X-direction. This array may be referred to as the Linear Uniformity array. As noted above, this array may be stored in the memory device 182 or the memory device 192.

The relationship between a uniform scan rate and the resulting dose pattern may be referred to as the linear uniformity profile.

The beam profiler 170 may also be used to generate a two-dimensional graph showing the shape and intensity of the spot beam. For example, in one embodiment, the controller 180 may instruct the scanner 140 to direct the spot beam to the center 202. The beam profiler 170 may then be moved in the X-direction so that different portions of the spot beam are measured by the beam profiler 170. In another embodiment, the two-dimensional graph may be created by keeping the beam profiler 170 stationary and using the scanner 140 to scan the spot beam in the X-direction. In another embodiment, the beam profiler 170 may be a two-dimensional array of Faraday devices so that the beam profiler 170 can detect and measure the entire spot beam. In all embodiments, a two-dimensional representation of the beam current as a function of both X-direction and Y-direction is created.

Figure 3:
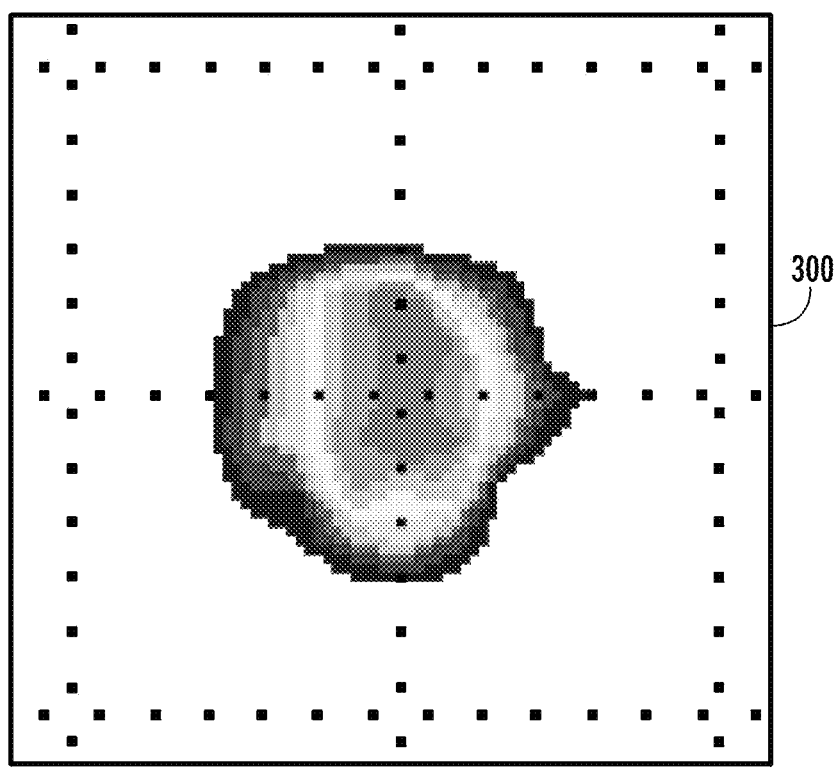
FIG. 3 shows the spot beam current profile according to one embodiment.

FIG. 3 shows the two-dimensional graph 300 of the spot beam current profile that may be created. This two-dimensional graph 300 shows the number of ions in the spot beam that strike the beam profiler 170 as a function of position in both the X-direction and the Y-direction. The different shading represents different amounts of the ions. For example, the number of ions may be highest in the center of the spot beam, and may decrease as the distance from the center increases. This two-dimensional graph 300 may be referred to as the two-dimensional current profile of the spot beam. The two-dimensional graph 300 may be stored in the non-transitory storage element as a two-dimensional array, where the value on each element in the array is representative of the beam current at that particular position. In one embodiment, each element in the array represents the average current for a square having each side equal to 7.5 mm. This array may be referred to as the Spot Beam Current Profile array. The size of the Spot Beam Current Profile array may be such that all non-zero values are included in the array. However, the Spot Beam Current Profile array may be smaller in size than the Desired Implant Pattern array, as explained below.

The present system and method use the Linear Uniformity array, the Spot Beam Current Profile array and the Desired Implant Pattern array to control the movements of the scanner 140 and the movable workpiece holder 160. Specifically, to achieve a desired implant pattern, the scanner 140 moves the spot beam in the first direction, and the movable workpiece holder 160 moves the workpiece in the second direction. In operation, the scanner 140 moves the spot beam from a first edge 201 of the workpiece to the opposite second edge 203, the movable workpiece holder 160 then moves the workpiece, and the scanner 140 moves the spot back to the first edge. This process is repeated a plurality of times until the entire workpiece 10 is processed.

Figure 4:
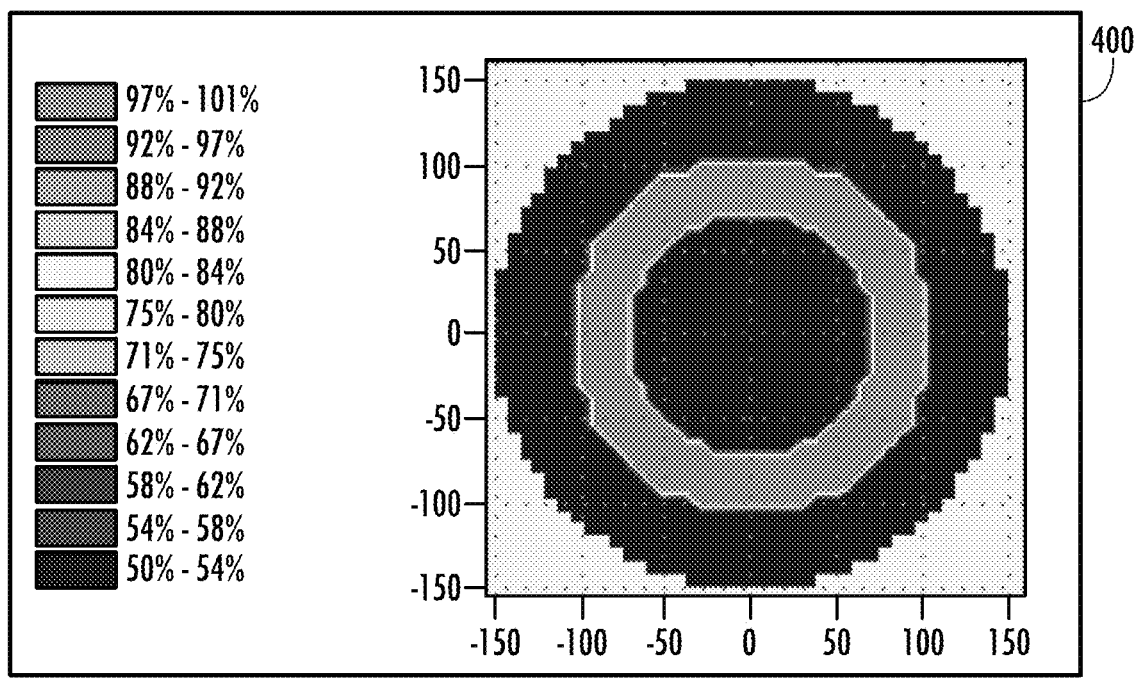
FIG. 4 shows one example of a desired implant pattern.

In some embodiments, the movement of the scanner 140 and the movable workpiece holder 160 are separate in time, such that only one component is moving at a time. In another embodiment, both components may move simultaneously FIG. 4 shows an example of a desired implant pattern 400. The desired implant pattern shown in FIG. 4 is for a 300 mm diameter workpiece. The center of the workpiece is designated as (0,0), and the ends are each about 150 mm from the center. This desired implant pattern may be stored in the non-transitory storage element as a two-dimensional array, where the value of each element in the array represents the desired dose at that particular position. For example, in one embodiment, each element of the two-dimensional array represents a square having each side equal to 7.5 mm. In this embodiment, the two-dimensional array would be 41×41. This array may be referred to as the Desired Implant Pattern array.

Note that the size of the Linear Uniformity array may be the same as the X dimension of the Desired Implant Pattern array. The Spot Beam Current Profile array may have a size that is different from the desired implant array. This is because the spot beam exposes a region that is much smaller than the totality of the workpiece at any point in time. Further, each element in these arrays may represent a region having the same size. For example, as described above, each element of the uniformity profile array represents a region that is 7.5 mm wide, while each element of the Spot beam Current Profile array and each element of the Desired Implant Pattern array represent a square region that is 7.5 mm in both directions. Of course, other dimensions may be used and the size of the arrays and the number of scans may be adjusted accordingly.

Figure 5:
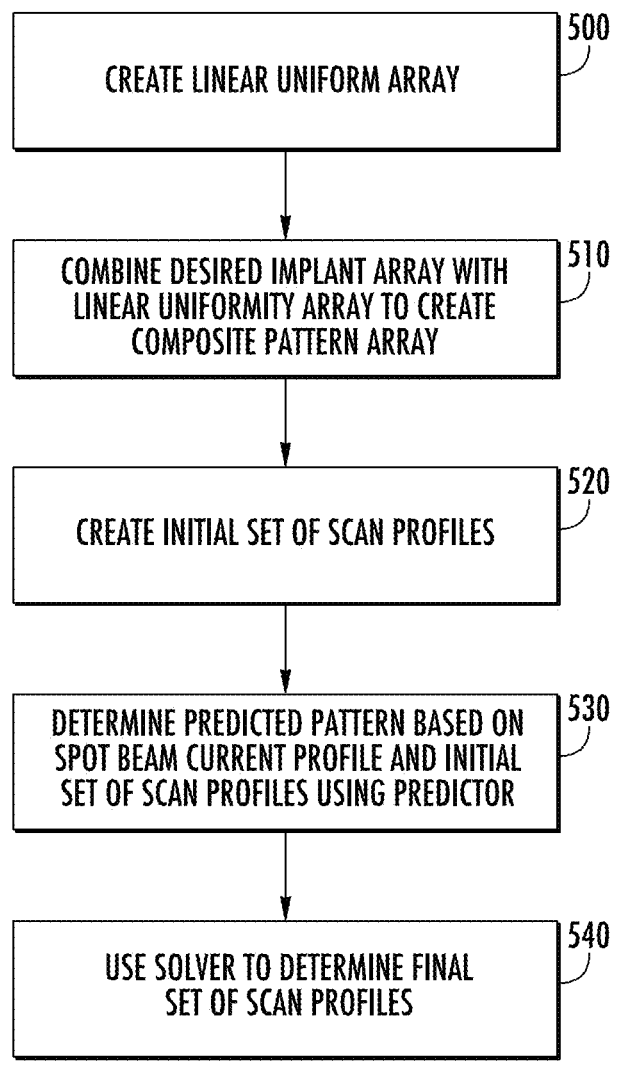
FIG. 5 is a flowchart showing the operation of the system according to one embodiment.

FIG. 5 shows a flow chart that may be performed by the system controller 195 to create the appropriate scan profiles for the scanner 140 and the movable workpiece holder 160.

First, as shown in Process 500, the controller 180 scans the scanner 140 in the X-direction at a constant speed to create the Linear Uniformity array, such as that shown in FIG. 2. This Linear Uniformity array may have one row and a plurality of columns. The system controller 195 combines the Linear Uniformity array with the Desired Implant Pattern array, as shown in Process 510. The Desired Implant Pattern may be input to the system controller 195. In one embodiment, this may be performed graphically, where the user enters the desired implant pattern on a graphical user interface (GUI) input device. In another embodiment, the desired implant pattern may be input to the system controller 195 as a two-dimensional array. The Desired Implant Pattern array may represent a pattern such as that shown in FIG. 4. These two arrays are then combined to create a Composite Pattern array.

As a rough approximation, the values of the Linear Uniformity array are directly proportional to the scan speed that may be used to create a uniform dose profile. In other words, assume that, in FIG. 2, the dose at first edge 201 is 150% of the dose at the center 202. To achieve a uniform linear dose, the scanner 140, when proximate to first edge 201, may move at a speed that is approximately 150% of the speed used near the center 202. In other words, assuming that dwell time multiplied by dose results in total current, longer dwell times are used when the dose is low. Conversely, shorter dwell times (i.e. higher scan rates) are used in regions with high dose values.

Each row in the Desired Implant Pattern array is then combined with the corresponding element in the Linear Uniformity array. In one embodiment, each element in each row of the Desired Implant Pattern array is divided by the corresponding element in the Linear Uniformity array to obtain the Composite Pattern array.

In other words, in certain embodiments, $$CompositePatternArray[x, y] = \frac{DesiredImplantPatternArray[x, y]}{NormalizedLinearUniformityArray[1, y]}$$

where x represents the row of the arrays and y represents the column of the arrays In this way, the non-uniformity of the scanner 140 is already incorporated into the Composite Pattern array.

Figure 6:
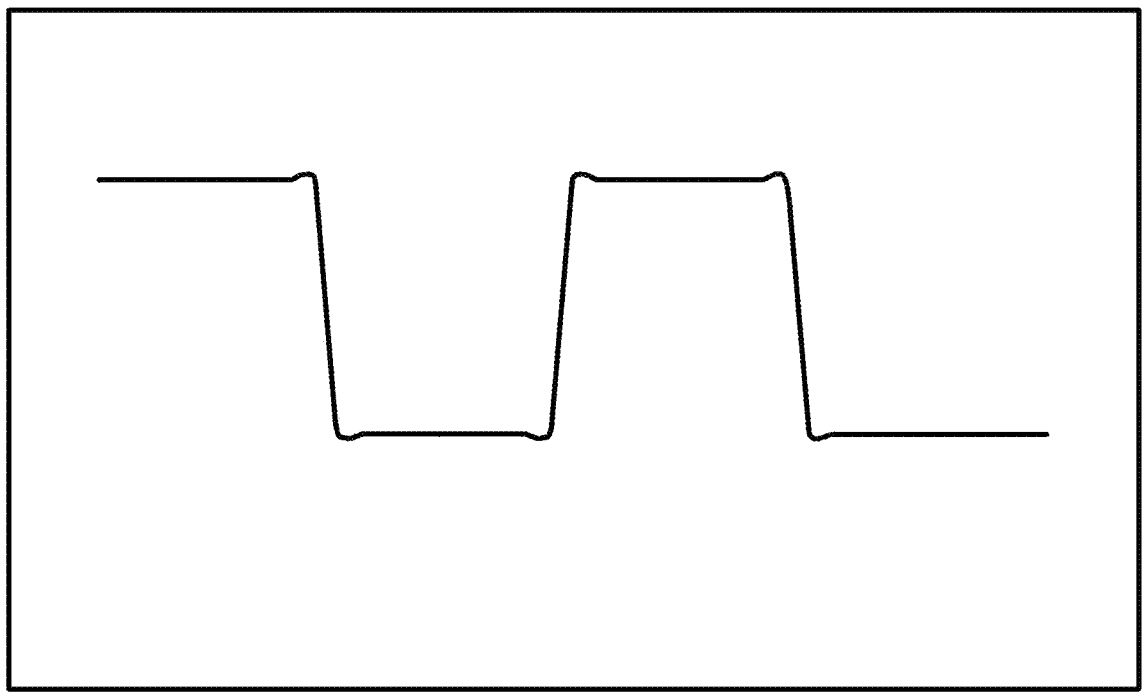
FIG. 6 graphically represents one row in the desired implant pattern.
Figure 7:
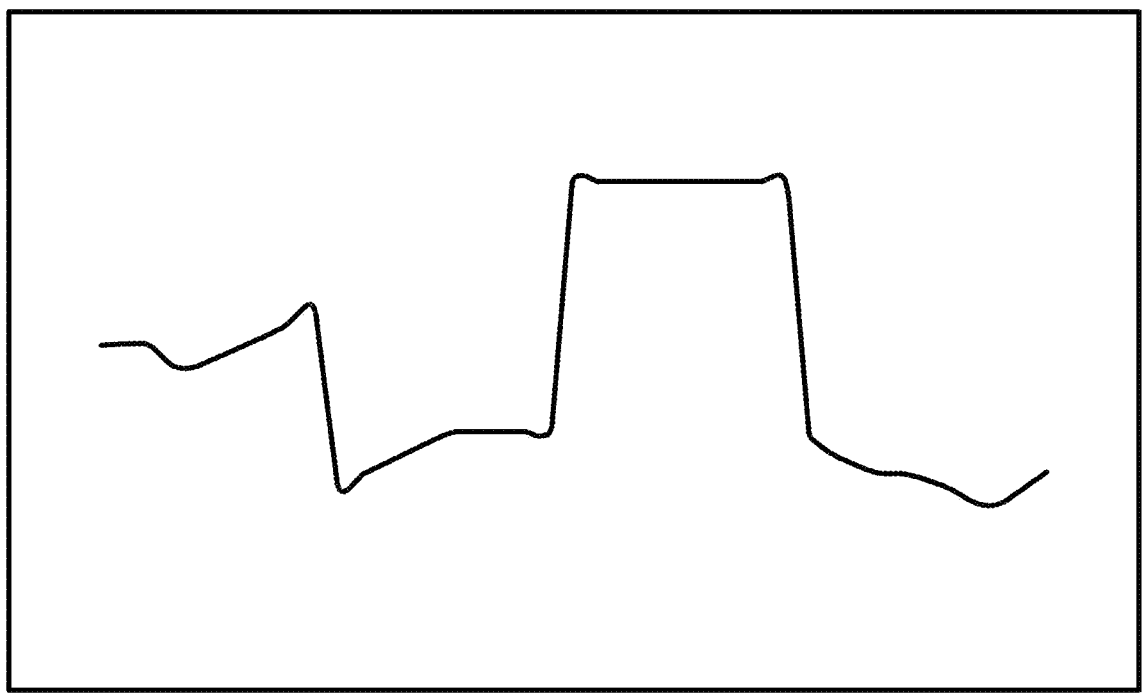
FIG. 7 graphically represents the row of FIG. 6 when combined with the linear uniformity array to form one row of the Composite Pattern array.

As an example, FIG. 2 shows a graph of the Linear Uniformity array. FIG. 6 shows a graphical representation of one row of the Desired Implant Pattern array. In this embodiment, the dopant is to be more heavily implanted in two regions. The Composite Pattern array for this row is then shown in FIG. 7. Note that the values near the left end of the row has been reduced. This is due to the increased dose that is provided by the scanner 140 at these locations. This process is repeated for each row of the Desired Implant Pattern Array. Thus, the Composite Pattern Array is of the same size as the Desired Implant Pattern Array.

In certain embodiments, after the Linear Uniformity array and the Desired Implant Pattern array have been combined, the result may be normalized. In one embodiment, the maximum value of Composite Pattern array is multiplied by a normalization factor so that it is set to the maximum dose in the Desired Implant Pattern array. All other elements in the Composite Pattern array are similarly scaled.

Once the Composite Pattern array has been created, the controller creates an initial Predicted Pattern array. The Predicted Pattern array may be created by assuming that the desired scan rate at a particular point is inversely proportional to the desired dose, as provided in the Composite Pattern array. Stated differently, the dwell time at a particular point is directly proportional to the desired dose, as provided in the Composite Pattern array.

As described above, the values of the Composite Pattern array are used to form an initial set of scan profiles, as shown in Process 520. In the simplest embodiment, the values of the Composite Pattern array are used to represent the dwell time at each location on the workpiece and are used to create the initial set of scan profiles.

In one embodiment, the spot beam is moved across the workpiece a plurality of times, where that plurality of times is equal to the number of rows in the Desired Implant Pattern Array. For example, in one embodiment, there are 41 rows in the Desired Implant Pattern array. Thus, in one embodiment, the spot beam is moved the workpiece across 41 times. In other embodiments, the spot beam may be moved across the workpiece more or fewer times. In some embodiments, the spot beam is moved across the workpiece 10 in the X-direction while the movable workpiece holder 160 is stationary. After the spot beam has passed the workpiece 10, the movable workpiece holder 160 then moves the workpiece in the Y-direction. In another embodiment, the movable workpiece holder 160 moves in the Y-direction while the scanner 140 is moving in the X-direction.

As noted above, the initial set of scan profiles may be related to the Composite Pattern array. For example, in one embodiment, the number of times that the spot beam is to be scanned is equal to the number of rows in the Composite Pattern array. In this embodiment, each scan profile may be exactly equal to one row of the Composite Pattern array, where the values in the scan profile are proportional to dwell time. In another embodiment, the number of times that the spot beam is to be scanned is greater than the number of rows in the Composite Pattern array. In this embodiment, each scan profile may be exactly equal to one row of the Composite Pattern array, where the values in the scan profile are proportional to dwell time. For example, if the number of scans is twice the number rows in the Composite Pattern array, the initial set of scan profiles may use each row of the Composite Pattern array twice. The same technique may be used regardless of the number of scans.

In this embodiment, the scan profiles are values that are representative of dwell time of a particular location. In other words, the values in the scan profiles are inversely proportional to scan speed at that location. In another embodiment, the scan profiles may be representative of scan speed.

The initial set of scan profiles may be used in conjunction with the Spot Beam Current Profile Array to generate an initial Predicted Pattern array, as shown in Process 530. Specifically, the spot beam current profile, shown in FIG. 3, is stored as an array, having a size that allows the Beam Current Profile array to contain at least most of the non-zero values of the spot beam current profile. The initial Predicted Pattern is created by simulating the movement of the spot beam across the workpiece based on the Beam Current Profile array and the initial set of scan profiles.

To explain this process, assume that the Composite Pattern array is [6,6] and the Spot Beam Current Profile array is [3,3]. The center of the spot beam is assumed to be at (2,2). Also assume that there are an initial set of 6 scan profiles, each identical to the values in a respective row of the Composite Pattern array, where the values in the scan profiles are proportional to dwell time at a particular location.

To calculate the initial Predicted Pattern, the value of each element in the Spot Beam Current Profile array is multiplied by the value in the scan profile where the center of the spot beam is currently located. The product of these two values is representative of the dose implanted in that location at that specific time. These products are then added to the Initial Predicted Pattern array at the corresponding locations.

However, since the Spot Beam Current Profile Array is larger than [1,1], the spot beam affects multiple locations on the workpiece as it is scanned. Thus, when the center of the spot beam is at location [4,4] of the workpiece, parts of the spot beam are also striking the workpiece at locations [5,3], [5,4], [5,5], [4,3], [4,5], [3,3], [3,4], and [3,5], because the spot beam current profile has a size of [3,3]. Thus, the value of the scan profile at this location (i.e. the dwell time) is multiplied by each element of the Spot Beam Current Profile array, and the results are added to each of the respective locations noted above. Similarly, when the center of the spot beam is moved along the X-direction to location [4,5] of the workpiece, parts of the spot beam are also striking the workpiece at locations [5,4], [5,5], [5,6], [4,4], [4,6], [3,4], [3,5], and [3,6]. Further, when the center of the spot beam is positioned at [5,4] after movement in the Y-direction, parts of the spot beam are also striking the workpiece at locations [6,3], [6,4], [6,5], [5,3], [5,5], [4,3], [4,4], and [4,5]. Thus, in this example, the total dose at a particular location on the workpiece is equal to the sum of nine values. Stated more generally, for a particular location on the workpiece, the total dose at that location is equal to the sum of a plurality of values, where that plurality is equal to the number of non-zero elements in the Spot Beam Current Profile array. Each of these values is the product of an element in the Spot Beam Current Profile array and a value from one of the scan profiles. This relationship assumes that the number of scans is equal to the number of rows in the Desired Implant Pattern array. If the number of scans is different from the number of rows in the Desired Implant Pattern array, the plurality may be a value other than that defined above.

This operation, which is contained within a software program referred to as the Predictor, yields an initial Predicted Pattern array. This array is of the same dimension as the Desired Implant Pattern array and the Composite Pattern array.

Once the initial Predicted Pattern array is calculated, a software program, referred to as the Solver, may be used to optimize the set of scan profiles, as shown in Process 540.

These optimized set of scan profiles are then used by the controller 180 to control the scanner 140 and the movable workpiece holder 160.

It is noted that the disclosure above provides one implementation for the Predictor which uses the Spot Beam Current Profile array and the set of scan profiles to create a Predicted Pattern Array. However, other implementations of the Predictor may be used. The Predictor is a software program that uses the spot beam current profile and a set of scan profiles to create an estimate of the resulting implant pattern. The output from the Predictor may be an array that reflects the dose that is implanted at each location on the workpiece, based on the provided inputs. Thus, the specific implementation of the Predictor is not limited to that described above.

As noted above, the system also includes a software program referred to as the Solver. This software program uses the desired implant pattern to generate an optimized set of scan profiles. In certain embodiments, the Solver may also utilize the Predictor to perform this function.

Figure 8:
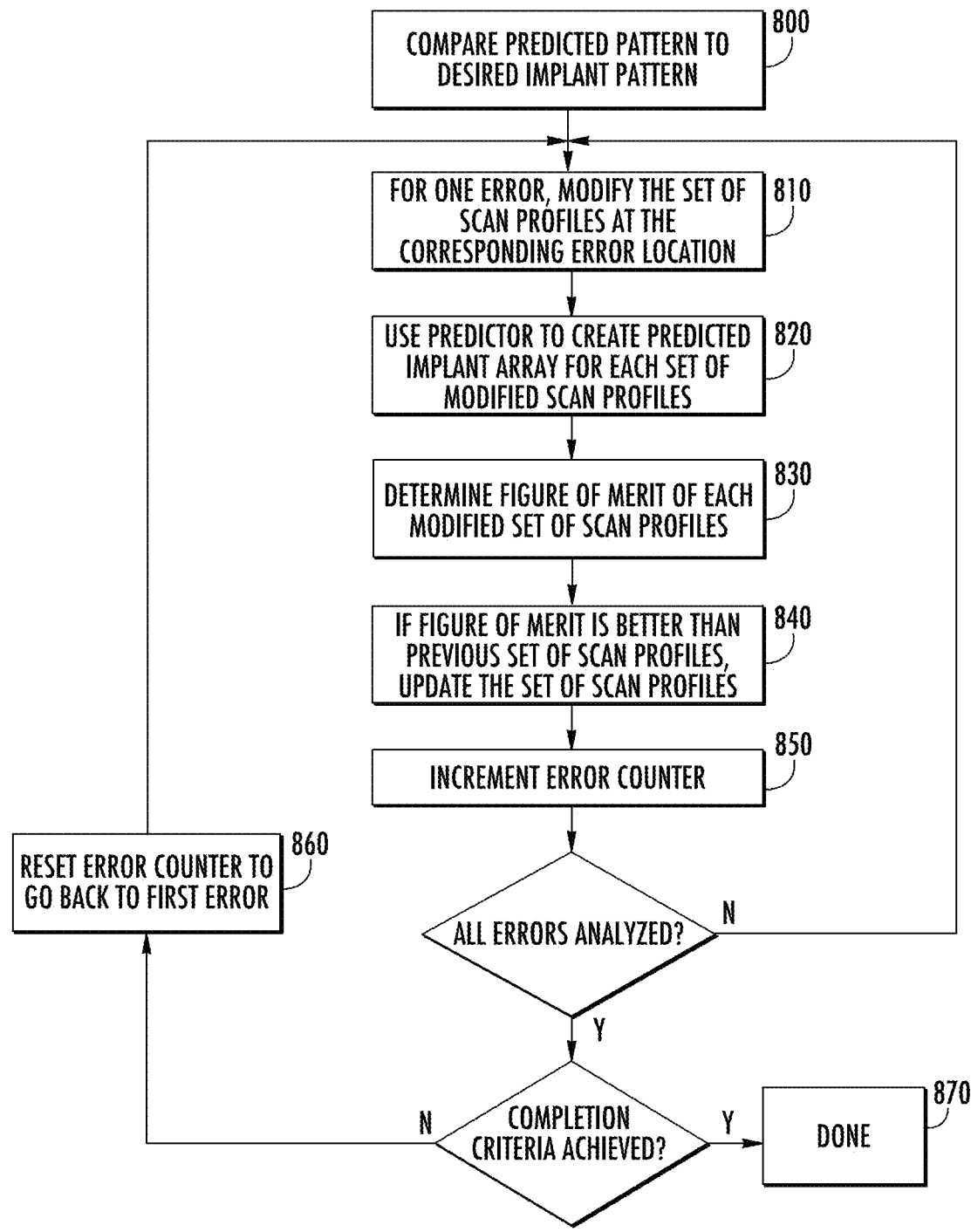
FIG. 8 shows a representative flow chart of the Solver according to one embodiment.

One embodiment of the Solver is shown in FIG. 8. First, the Predicted Pattern array is compared to the Desired Implant Pattern array to determine how closely it represents the desired implant pattern, as shown in Process 800.

In one embodiment, each element of the initial Predicted Pattern array is compared to the corresponding element in the Desired Implant Pattern array. Variations greater than a predetermined threshold, known as errors, are counted and the positions of these errors, referred to as error locations, is recorded.

For each of the errors, the scan profile is adjusted. For example, the value for a first error location in the set of scan profiles is modified, as shown in Process 810. In one embodiment, two new sets of scan profiles, called interim sets of scan profiles, are created; a first in which the value of the first error location is increased, and a second in which the value of the error location is decreased. A predicted implant pattern is then created for each of these interim sets of scan profiles using the Predictor, as shown in Process 820. The figure of merit of each predicted implant pattern is then calculated, as shown in Process 830. The figure of merit of a predicted implant pattern may be determined based on the number of errors and the magnitude of those errors. In some embodiments, the figure of merit may weight different points in the Predicted Pattern array differently.

If the figure of merit of one of the new predicted implant patterns is better than the existing Predicted Implant Pattern array, then the scan profiles are updated to incorporate the changes that were made to create the new predicted implant pattern, as shown in Process 840. If the figure of merit of the two new predicted implant pattern is not better than the existing Predicted Implant Pattern array, then the scan profiles are not changed.

The error counter is then incremented, as shown in Process 850. If all of the errors have not been analyzed, the program returns to Process 810 and Processes 810-840 may be repeated for the next error in the list.

If all of the errors have been analyzed, the Solver determines whether the current set of scan profiles meets a predetermined completion criteria. If this completion criteria is not met, the error counter is reset to go back to the first error, as shown in Process 860. The completion criteria may be based on the figure of merit of the current predicted implant pattern, the number of times that the error list has been processed, or other criteria. The Processes 810-840 are then repeated again for all of the errors in the list.

If the current set of scan profiles meets a predetermined completion criteria, the Solver is done, as shown in Process 870. The output of the Solver is the set of scan profiles that are to be used by the controller 180 to control the scanner 140.

Thus, in one embodiment, this disclosure describes a system comprising an ion source 100 for generating a spot ion beam, a scanner 140 to move the spot beam in a first direction, a movable workpiece holder 160 to move the workpiece 10 in a second direction, a beam profiler 170 to measure the number of ions as a function of position, and a system controller 195. The system controller 195 executes the sequence of processes shown in FIG. 5 and uses the final set of scan profiles to control the movement of the scanner 140 and the movable workpiece holder 160. One of the processes utilizes the Solver software program, which is illustrated in FIG. 8.

In another embodiment, the disclosure describes a system comprising an ion source 100 for generating a spot ion beam, a scanner 140 to move the spot beam in a first direction, a movable workpiece holder 160 to move the workpiece 10 in a second direction, a beam profiler 170 to measure the number of ions as a function of position, and a system controller 195. The controller 180 executes Process 500 in FIG. 5 and passes the results to the second computing unit 190. The second computing unit 190 performs the remainder of the processes shown in FIG. 5, including the processes shown in FIG. 8. The resulting set of scan profiles are then transferred back to the controller 180. The controller 180 then controls the movement of the scanner 140 and the movable workpiece holder 160.

In another embodiment, the disclosure describes a software program that combines a Linear Uniformity array and a Desired Implant Pattern array to create a Composite Pattern array. The software program then creates a set of scan profiles that achieves the Composite Pattern array. The software program resides in a non-transitory storage medium that is readable by a processing unit.

In another embodiment, the disclosure describes a method of scanning a spot beam to create a desired implant pattern. The method involves determining a linear uniformity of a scanned spot beam; and combining the linear uniformity with a desired implant pattern to create a composite pattern, as shown in Processes 500-510 in FIG. 5. The method then creates an initial set of scan profiles based on the composite pattern, as shown in Process 520. The method then calculates a predicted implant pattern based on the spot beam current profile and the initial set of scan profiles, as shown in Process 530. In a further embodiment, the method includes a sequence to optimize this initial set of scan profiles. In certain embodiments, the values in the initial set of scan profiles are modified to determine the effect that the modification has on the predicted implant pattern. Any modification that results in an improved predicted implant pattern are saved. This may be repeated until certain completion criteria are met.

The embodiments described above in the present application may have many advantages. The present system and method do not utilize a tuning step, wherein the scan rate of the scanner 140 is varied in order to create a uniform beam. By eliminating this step, the process is shortened. In other words, the present system combines the linear uniformity array with the desired implant pattern to create a composite pattern array. The system then attempts to create a set of scan profiles that achieves this composite pattern array. Again, at no point is the scanner 140 manipulated to create a uniform beam in the X-direction. This may improve the utilization of the system, as fewer calibration steps are performed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of scanning a spot beam to achieve a desired implant pattern, comprising:
   creating a Desired Implant Pattern array based on the desired implant pattern;

scanning the spot beam, using a scanner, in an X-direction at a constant speed;
monitoring beam current as a function of position in the X-direction using a beam profiler;
creating a Linear Uniformity array, where values of elements in the Linear Uniformity array are indicative of beam current at a respective position in the X-direction;
measuring a current profile of the spot beam in the X-direction and a Y-direction, perpendicular to the Y-direction;
creating a Spot Beam Current Profile array, where values of elements in the Spot Beam Current Profile array are indicative of a current of the spot beam at a location in the X-direction and the Y-direction;
using the Linear Uniformity array and the Desired Implant Pattern array to create a Composite Pattern array, where the Composite Pattern array incorporates non-uniformity of the scanned spot beam in the X-direction;
creating a final set of scan profiles to achieve the Composite Pattern array based on the Spot Beam Current Profile array; and
applying the final set of scan profiles to the scanner to achieve the desired implant pattern.

2. The method of claim 1, wherein an initial set of scan profiles are created based on the Composite Pattern array and the Spot Beam Current Profile array.

3. The method of claim 2, wherein a Predicted Pattern array is created based on the initial set of scan profiles.

4. The method of claim 3, wherein corresponding elements in the Composite Pattern array and the Predicted Pattern array are compared, and differences greater than a predetermined threshold are flagged as errors, and a number of errors and a location of each error, referred to as error locations, is recorded.

5. The method of claim 4, wherein the initial set of scan profiles is modified at one of the error locations to create an interim set of scan profiles.

6. The method of claim 5, wherein a new Predicted Pattern array is created based on the interim set of scan profiles, and if a figure of merit of the new Predicted Pattern array is better than an existing Predicted Pattern array, the interim set of scan profiles is saved as an updated set of scan profiles and if the figure of merit of the new Predicted Pattern array is not better than the existing Predicted Pattern array, the initial set of scan profiles is saved as the updated set of scan profiles.

7. The method of claim 6, where, for each of the error locations, the updated set of scan profiles is modified at another of the error locations to create a new interim set of scan profiles, and another Predicted Pattern array is created based on the new interim set of scan profiles, and if the figure of merit of the new Predicted Pattern array is better than an existing Predicted Pattern array, the new interim set of scan profiles is saved as the updated set of scan profiles and if the figure of merit of the new Predicted Pattern array is not better than the existing Predicted Pattern array, the updated set of scan profiles is not changed.

8. The method of claim 1, wherein for each row of the Desired Implant Pattern array, each element in a row of the Desired Implant Pattern array is divided by a corresponding element in the Linear Uniformity array to form a row of the Composite Pattern array.

9. An implantation system that uses a spot beam to implant a desired implant pattern into a workpiece, comprising:

an ion source to create the spot beam;
a scanner to scan the spot beam in an X-direction;
a workpiece holder to move a workpiece in a Y-direction;
a beam profiler; and
a system controller, wherein the system controller is adapted to:
scan the spot beam, using the scanner, in the X-direction at a constant speed;
monitor beam current as a function of position in the X-direction using the beam profiler;
create a Linear Uniformity array, where values of elements in the Linear Uniformity array are indicative of a beam current at a respective position in the X-direction;
measure a current profile of the spot beam in the X-direction and the Y-direction, perpendicular to the X-direction;
create a Spot Beam Current Profile array, where values of elements in the Spot Beam Current Profile array are indicative of a current of the spot beam at a location in the X-direction and the Y-direction;
create a Desired Implant Pattern array based on the desired implant pattern;
use the Linear Uniformity array and the Desired Implant Pattern array to create a Composite Pattern array, where the Composite Pattern array incorporates non-uniformity of the scanned spot beam in the X-direction;
create a final set of scan profiles to achieve the Composite Pattern array based on the Spot Beam Current Profile array; and
apply the final set of scan profiles to the scanner to achieve the desired implant pattern.

10. The implantation system of claim 9, wherein the system controller creates an initial set of scan profiles based on the Composite Pattern array and the Spot Beam Current Profile array.

11. The implantation system of claim 10, wherein the system controller creates a Predicted Pattern array based on the initial set of scan profiles.

12. The implantation system of claim 11, wherein the system controller compares corresponding elements in the Composite Pattern array and the Predicted Pattern array, and flags differences greater than a predetermined threshold as errors, and records a number of errors and a location of each error, referred to as error locations.

13. The implantation system of claim 12, wherein the system controller modifies the initial set of scan profiles at one of the error locations to create an interim set of scan profiles.

14. The implantation system of claim 13, wherein the system controller creates a new Predicted Pattern array based on the interim set of scan profiles, and if a figure of merit of the new Predicted Pattern array is better than an existing Predicted Pattern array, the system controller saves the interim set of scan profiles as an updated set of scan profiles and if the figure of merit of the new Predicted Pattern array is not better than the existing Predicted Pattern array, the system controller saves the initial set of scan profiles as the updated set of scan profiles.

15. The implantation system of claim 9, wherein for each row of the Desired Implant Pattern array, the system controller divides each element in a row of the Desired Implant Pattern array by a corresponding element in the Linear Uniformity array to form a row of the Composite Pattern array.

16. A software program, disposed on a non-transitory computer readable storage media, which when executed by a system controller, enables the system controller to:

create a Desired Implant Pattern array based on a desired implant pattern;

monitor beam current as a function of position in an X-direction using a beam profiler as a spot beam is scanned in the X-direction at a constant speed;

create a Linear Uniformity array, where values of elements in the Linear Uniformity array are indicative of a beam current at a respective position in the X-direction;

create a Spot Beam Current Profile array, where values of elements in the Spot Beam Current Profile array are indicative of a current of the spot beam at a location in the X-direction and a Y-direction;

use the Linear Uniformity array and the Desired Implant Pattern array to create a Composite Pattern array, where the Composite Pattern array incorporates non-uniformity of the scanned spot beam in the X-direction;

create a final set of scan profiles to achieve the Composite Pattern array based on the Spot Beam Current Profile array; and apply the final set of scan profiles to a scanner to achieve the desired implant pattern.

17. The software program of claim 16, wherein for each row of the Desired Implant Pattern array, each element in a row of the Desired Implant Pattern array is divided by a corresponding element in the Linear Uniformity array to form a row of the Composite Pattern array.

\* \* \* \* \*